United States Patent
Chen et al.

(10) Patent No.: US 8,258,883 B2
(45) Date of Patent: Sep. 4, 2012

(54) SYSTEM AND METHOD FOR CHARACTERIZING PROCESS VARIATIONS

(75) Inventors: Yi-Wei Chen, Hsin-Chu (TW); Chi-Wei Hu, Pingzhen (TW); Wei-Pin Changchien, Taichung (TW); Chin-Chou Liu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 62 days.

(21) Appl. No.: 12/617,391

(22) Filed: Nov. 12, 2009

(65) Prior Publication Data

US 2010/0176890 A1 Jul. 15, 2010

Related U.S. Application Data

(60) Provisional application No. 61/144,672, filed on Jan. 14, 2009.

(51) Int. Cl.
*H03K 3/03* (2006.01)
*G01R 23/175* (2006.01)
*G01R 31/26* (2006.01)

(52) U.S. Cl. .......... 331/57; 324/76.54; 324/762.09; 327/153; 327/161; 327/271; 327/281; 327/288; 702/79

(58) Field of Classification Search .......... 331/57; 324/76.39, 76.54, 762.09; 327/149, 153, 327/158, 161, 271, 281, 284, 288; 368/118; 702/57, 79; 716/136
See application file for complete search history.

(56) References Cited

U.S. PATENT DOCUMENTS

| | | | | |
|---|---|---|---|---|
| 4,164,666 A | * | 8/1979 | Hirasawa | 326/97 |
| 4,494,021 A | * | 1/1985 | Bell et al. | 327/262 |
| 5,365,204 A | * | 11/1994 | Angiulli et al. | 331/57 |
| 5,461,591 A | * | 10/1995 | Kim et al. | 365/226 |
| 6,724,268 B2 | | 4/2004 | Takahashi | |
| 6,774,734 B2 | | 8/2004 | Christensen et al. | |
| 6,958,659 B2 | * | 10/2005 | Nakajima | 331/57 |
| 7,069,525 B2 | * | 6/2006 | Bhushan et al. | 716/136 |
| 7,205,854 B2 | | 4/2007 | Liu | |
| 7,323,908 B2 | * | 1/2008 | Chuang et al. | 326/83 |
| 7,675,372 B2 | * | 3/2010 | Bang et al. | 331/57 |

OTHER PUBLICATIONS

Bhushan, M., et al., "Ring Oscillator Based Technique for Measuring Variability Statistics," Microelectronic Test Structures, 2006, IEEE International Conference, pp. 87-92.

* cited by examiner

*Primary Examiner* — Levi Gannon
(74) *Attorney, Agent, or Firm* — Slater & Matsil, L.L.P.

(57) ABSTRACT

A system and method for characterizing process variations are provided. A circuit comprises a plurality of inverters arranged in a sequential loop, and a plurality of transmission gates, with each transmission gate coupled between a pair of serially arranged inverters. Each transmission gate comprises a first field effect transistor (FET) having a first channel, and a second FET having a second channel. The first channel and the second channel are coupled in parallel and a gate terminal of the first FET and a gate terminal of the second FET are coupled to a first control signal and a second control signal, respectively.

24 Claims, 6 Drawing Sheets

SYSTEM AND METHOD FOR CHARACTERIZING PROCESS VARIATIONS

This application claims the benefit of U.S. Provisional Patent Application Ser. No. 61/144,672, filed on Jan. 14, 2009, and entitled "System and Method for Characterizing Process Variations," which application is incorporated herein by reference.

TECHNICAL FIELD

The present invention relates generally to semiconductor devices, and more particularly to a system and method for characterizing process variations.

BACKGROUND

Semiconductors are used in integrated circuits for a wide range of applications, including personal computers, music and/or video devices, multimedia devices, digital assistants, communications devices, and so forth. In general, integrated circuits manufactured using modern fabrication processes may be extremely consistent, with individual integrated circuits from a single wafer being substantially identical to one another in terms of performance.

However, fabrication process variations (or simply, process variations) may occur. Process variations may impact field effect transistor channel widths and lengths, gate oxide thicknesses, doped material concentrations, and so forth. A fairly common side-effect due to variations in the fabrication process used to create integrated circuits may be changes in threshold voltage ($V_{TH}$) of transistors in the integrated circuits. A change in threshold voltage may alter leakage current, which may impact dynamic random access memory (DRAM) charge retention times, transistor operating speeds, and so forth.

Figure 1A:
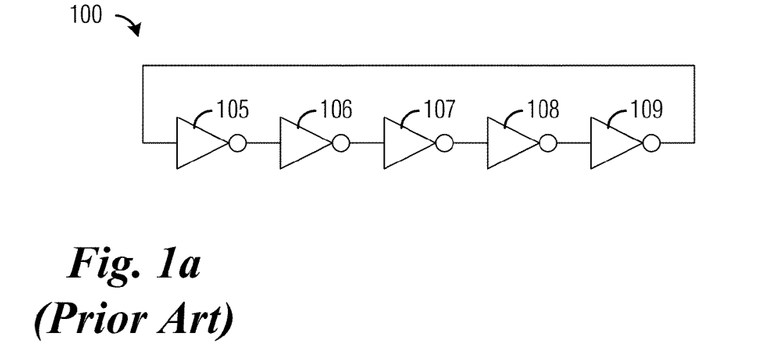
FIG. 1a is a diagram of a prior art ring oscillator.

FIG. 1a is a diagram of a prior art ring oscillator 100 used to characterize process variations in an integrated circuit. Ring oscillator 100 comprises an odd number of inverters 105-109 arranged serially in a loop. When an integrated circuit containing ring oscillator 100 is powered on, ring oscillator 100 will also be energized and automatically produce a clock signal at a frequency that is a function of inverters 105-109. The frequency of the clock signal may be measured to determine global process variations. For example, if the frequency of the clock signal is greater than an expected frequency based on nominal values for inverters 105-109, then the threshold voltage of at least one of the inverters may have decreased below an expected value. Similarly, if the frequency of the clock signal is smaller than the expected frequency, then the threshold voltage of at least one of the inverters may have increased beyond the expected value.

Figure 1B:
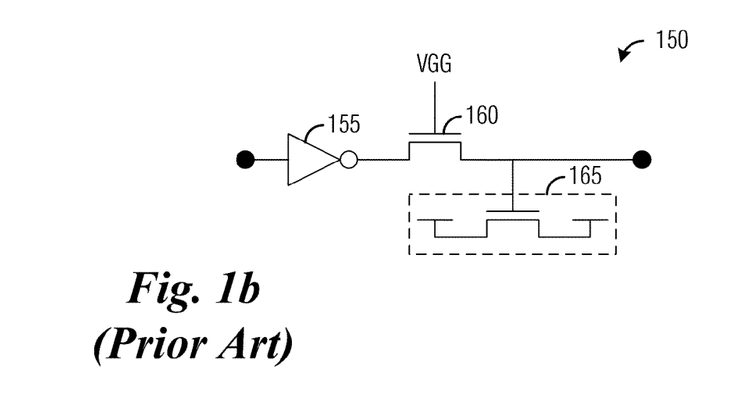
FIG. 1b is a diagram of a single stage of a prior art ring oscillator.

FIG. 1b is a diagram of a prior art single stage of a ring oscillator 150. Rather than having only inverters arranged serially in a loop, each stage of ring oscillator 150 comprises an inverter 155 and a pass gate 160. Each stage also includes an effective load 165 modeled as a capacitor. Effective load 165 may be representative of a subsequent stage coupled to pass gate 160. Pass gate 160 may be used to make or break the loop. Pass gate 160 may be implemented using a field effect transistor (FET), such as an NFET or a PFET. Preferably, each stage of ring oscillator 150 includes a pass gate formed from the same type of FET. The use of a particular type of FET may allow for a characterization of process variations for that particular type of FET. For example, if NFETs are used to implement pass gate 160, then it may be possible to determine global process variations for NFETs. Similarly, if PFETs are used, then it may be possible to determine global process variations for PFETs.

Figure 2:
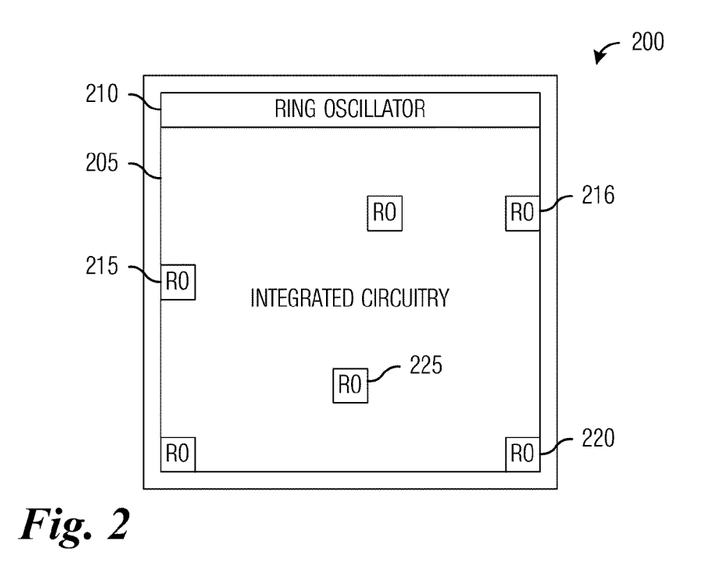
FIG. 2 is a diagram of an integrated circuit including a number of ring oscillators.

FIG. 2 is a diagram of an integrated circuit 200. Integrated circuit 200 includes integrated circuitry 205 that implements the functionality of integrated circuit 200. Integrated circuit 200 also includes several ring oscillators, such as ring oscillator 210 arranged along a top side of integrated circuit 200, ring oscillators 215-216 arranged along left and right edges of integrated circuit 200, ring oscillator 220 arranged on a lower right hand corner of integrated circuit 200, ring oscillator 225 formed in an interior of integrated circuit 200, and so forth. A ring oscillator may also be formed along more than one edge of integrated circuit 200. Using the ring oscillators may allow for a measurement of process variations throughout integrated circuit 200. In general, it is desirable to have multiple ring oscillators or a large ring oscillator distributed over different portions of integrated circuit 200 so that the elements of the ring oscillators may encounter process variations like the circuitry in integrated circuit 200. FIG. 2 may illustrate an exaggerated use of ring oscillators in an integrated circuit.

SUMMARY OF THE INVENTION

These and other problems are generally solved or circumvented, and technical advantages are generally achieved, by embodiments of a system and a method for characterizing process variations.

In accordance with an embodiment, a circuit is provided. The circuit includes a plurality of inverters arranged in a sequential loop, and a plurality of transmission gates, with each transmission gate coupled between a pair of serially arranged inverters. Each transmission gate includes a first field effect transistor (FET) having a first channel, and a second FET having a second channel. The first channel and the second channel are coupled in parallel, and a gate terminal of the first FET and a gate terminal of the second FET are coupled to a first control signal and a second control signal, respectively.

In accordance with another embodiment, an integrated circuit is provided. The integrated circuit includes integrated circuitry disposed on a substrate, and a ring oscillator disposed on the substrate. The integrated circuitry performs operations, and the ring oscillator produces a clock signal at a frequency dependent on a configuration of elements in the ring oscillator. The ring oscillator includes a plurality of inverters serially arranged in a loop, and a plurality of transmission gates, with each transmission gate coupled between a pair of inverters, each transmission gate has two field effect transistors (FET) arranged in parallel, with a gate terminal of a first FET coupled to a first control signal and a gate terminal of a second FET coupled to a second control signal.

In accordance with another embodiment, a method for measuring process variations is provided. The method includes characterizing process variations of a first type of field effect transistor (FET) in an integrated circuit using a ring oscillator, and characterizing process variations of a second type of FET in the integrated circuit using the ring oscillator.

An advantage of an embodiment is that localized process variations may be quantified, permitting a greater degree of accuracy in locating process variations.

A further advantage of an embodiment is that localized and global process variations for both NFET and PFET transistors may be determined using a single ring oscillator. This may simplify implementation as well as reduce integrated circuit real estate used in process variation determination.

Yet another advantage of an embodiment is that the ring oscillator produces a digital output, enabling easy measurement and processing.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which:

FIG. 4b is a diagram of an equivalent circuit of the ring oscillator in FIG. 4a;

FIG. 5b is a diagram of an equivalent circuit of the ring oscillator in FIG. 5a;

FIG. 6b is a diagram of an equivalent circuit of the ring oscillator in FIG. 6a;

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely an integrated circuit for use in an electronic device, wherein there is a desire to measure fabrication process variations.

Figure 3A:
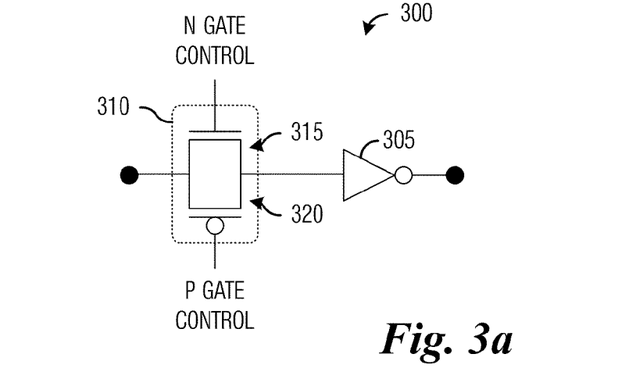
FIG. 3a is a diagram of a single stage of a ring oscillator.

FIG. 3a is a diagram of a single stage 300 of a ring oscillator comprising an odd number of stages arranged serially in a loop. Stage 300 includes an inverter 305 and a transmission gate 310 coupled to an input of inverter 305. Transmission gate 310 includes an NFET 315 and a PFET 320 with their channels arranged in a parallel and their drain terminals coupled together and their source terminals coupled together. A gate terminal of NFET 315 may be coupled to an "N GATE CONTROL" control signal and a gate terminal of PFET 320 may be coupled to a "P GATE CONTROL" control signal.

According to an embodiment, the "N GATE CONTROL" and "P GATE CONTROL" control signals may be independent signals, enabling NFET 315 and PFET 320 to be turned on or off independent of each other. When either NFET 315 or PFET 320 or both are turned on (N GATE CONTROL=1 for NFET 315 and P GATE CONTROL=0 for PFET 320), a signal at input of transmission gate 310 may propagate to inverter 305, while when both NFET 315 and PFET 320 are turned off, the signal at input of transmission gate 310 FIG. may not propagate to inverter 305.

Figure 3B:
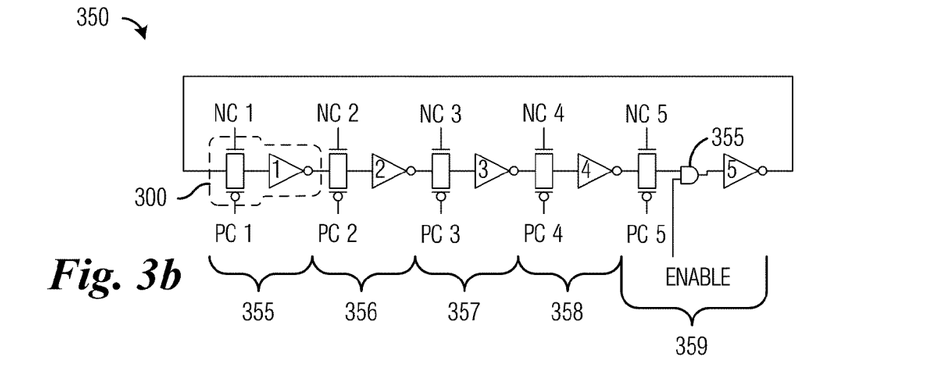
FIG. 3b is a diagram of a ring oscillator.

Although ring oscillator 350 is shown with a transmission gate in each stage, alternative embodiments may have fewer transmission gates than stages. The smaller number of transmission gates may simplify the characterizing of process variations while providing some degree of localized characterizing of process variations. Furthermore, the smaller number of transmission gates may help to reduce the size and complexity of the ring oscillators.

FIG. 3b is a diagram of a ring oscillator 350 formed from an odd number of stages 300. As shown in FIG. 3b ring oscillator 350 includes five stages 355-359. Each stage 355-359 may have as input independent "N GATE CONTROL" and "P GATE CONTROL" control signals, for example, stage 355 may have as input "N GATE CONTROL (NC 1)" and "P GATE CONTROL (PC 1)" control signals. As discussed previously, the use of independent control signals may allow for the individual control of transistors in each pass gate in ring oscillator 350.

Ring oscillator 350 further includes an enable that may be used to turn ring oscillator 350 on or off. As shown in FIG. 3b, the enable may be implemented as an AND gate 355 and an ENABLE control signal. AND gate 355 may have the ENABLE control signal as a first input and, depending on location of AND gate 355, an output of a transmission gate or an inverter as a second input. Although shown in FIG. 3b as being a part of stage 359, AND gate 355 may also be placed in between adjacent stages.

Figure 4A:
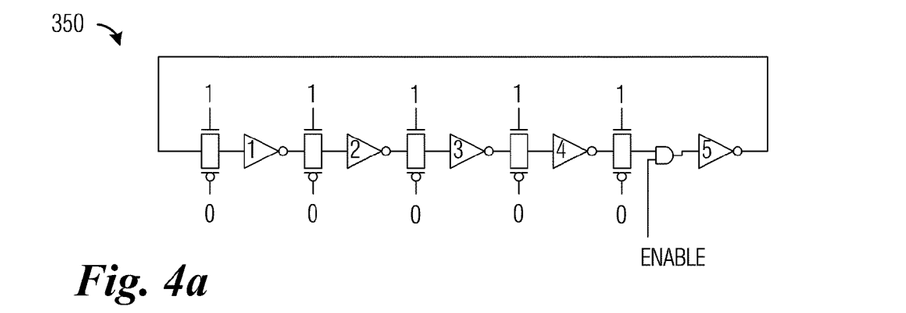
FIG. 4a is a diagram of a ring oscillator with specific control signals applied to transistors in transmission gates in the ring oscillator.
Figure 4B:
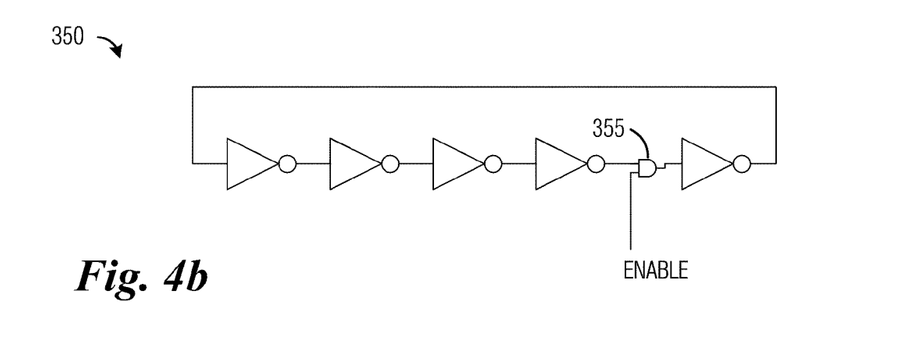

FIG. 4a is a diagram illustrating ring oscillator 350 in operation. As shown in FIG. 4a, the "N GATE CONTROL" control signals are set to one (1) and the "P GATE CONTROL" control signals are set to zero (0). This results in both the NFET and the PFET in each transmission gate being turned on. With the transmission gates being turned on, the transmission gates effectively disappear from ring oscillator 350. FIG. 4b is a diagram illustrating an equivalent circuit for ring oscillator 350 with all of the transmission gates being turned on. With exception of AND gate 355, ring oscillator 350 as shown in FIG. 4b is equivalent to prior art ring oscillator 100 (FIG. 1a).

Figure 5A:
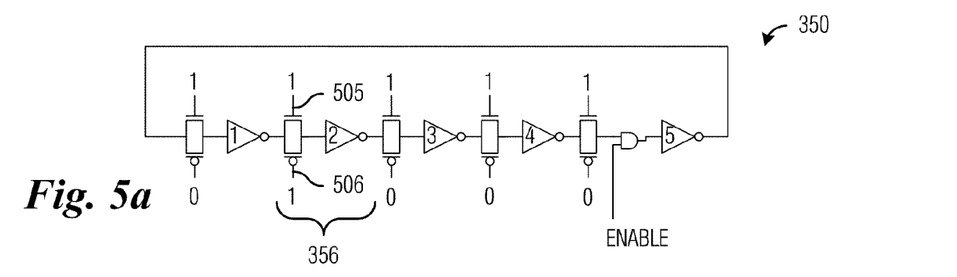
FIG. 5a is a diagram of a ring oscillator with specific control signals applied to transistors in transmission gates in the ring oscillator.

FIG. 5a is a diagram illustrating ring oscillator 350 in operation. As shown in FIG. 5a, all of the "N GATE CONTROL" control signals are set to one (1) and all of the "P GATE CONTROL" control signals, with exception of the "P GATE CONTROL" control signal for stage 356 being set to one (1), are set to zero (0). This results in both the NFET and the PFET in each transmission gate (except for the transmission gate in stage 356) being turned on and effectively disappearing from ring oscillator 350.

Figure 5B:
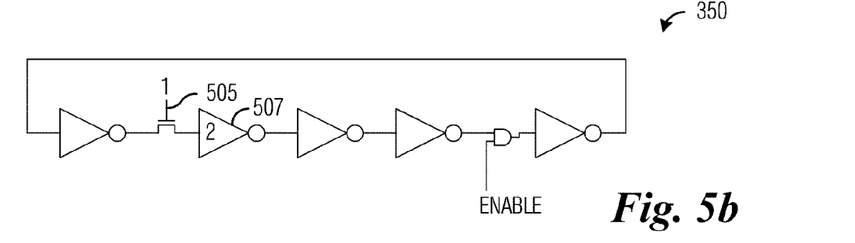

The transmission gate in stage 356 may have its NFET 505 turned on and its PFET 506 turned off. With PFET 506 turned off, NFET 505 remains in ring oscillator 350. FIG. 5b is a diagram illustrating an equivalent circuit for ring oscillator 350. Since NFET 505 remains in ring oscillator 350, it may have an impact on the frequency of ring oscillator 350.

Figure 5C:
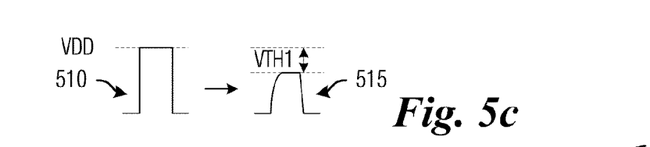
FIG. 5c is a diagram of the impact of a transistor left on in a transmission gate.

FIG. 5c is a diagram illustrating the impact of NFET 505 in ring oscillator 350. Pulse 510 represents a pulse provided to a first terminal (such as a source terminal) of NFET 505 and pulse 515 represents a pulse at a second terminal (such as a drain terminal) of NFET 505 resulting from pulse 510. Pulse 515 may be reduced by an amount substantially equal to the threshold voltage of NFET 505 ($V_{TH1}$). If the $V_{TH1}$ is large, then pulse 515 may be significantly smaller than pulse 510, while if $V_{TH1}$ is small, then pulse 515 may be about equal to pulse 510. Therefore, if pulse 515 is small, then the output of inverter 507 may be slowed due to the small voltage potential (and correspondingly small current) of pulse 515, thereby impacting the frequency of ring oscillator 350. The frequency of ring oscillator 350 may then be measured and used to determine process variations present in NFET 505 (if any).

Figure 6A:
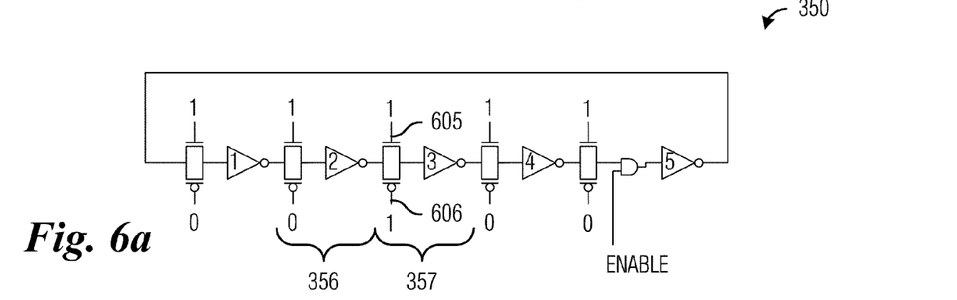
FIG. 6a is a diagram of a ring oscillator with specific control signals applied to transistors in transmission gates in the ring oscillator.

FIG. 6a is a diagram illustrating ring oscillator 350 in operation. As shown in FIG. 6a, all of the "N GATE CONTROL" control signals are set to one (1) and all of the "P GATE CONTROL" control signals, with exception of the "P GATE CONTROL" control signal for stage 357 being set to one (1), are set to zero (0). This results in both the NFET and the PFET in each transmission gate (except for the transmission gate in stage 357) being turned on and effectively disappearing from ring oscillator 350.

Figure 6B:
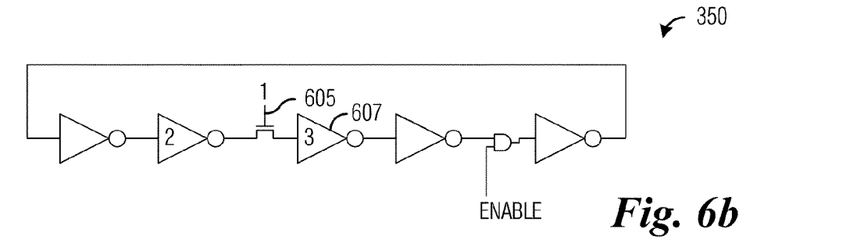

The transmission gate in stage 357 may have its NFET 605 turned on and its PFET 606 turned off. With PFET 606 turned off, NFET 605 remains in ring oscillator 350. FIG. 6b is a diagram illustrating an equivalent circuit for ring oscillator 350. Since NFET 605 remains in ring oscillator 350, it may have an impact on the frequency of ring oscillator 350.

Figure 6C:
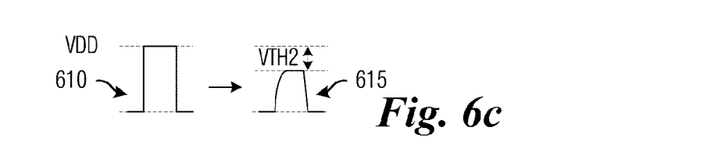
FIG. 6c is a diagram of the impact of a transistor left on in a transmission gate.

FIG. 6c is a diagram illustrating the impact of NFET 605 in ring oscillator 350. Pulse 610 represents a pulse provided to a first terminal (such as a source terminal) of NFET 605 and pulse 615 represents a pulse at a second terminal (such as a drain terminal) of NFET 605 resulting from pulse 610. Pulse 615 may be reduced by an amount substantially equal to the threshold voltage of NFET 605 ($V_{TH2}$). If the $V_{TH2}$ is large, then pulse 615 may be significantly smaller than pulse 610, while if $V_{TH2}$ is small, then pulse 615 may be about equal to pulse 610. Therefore, if pulse 615 is small, then the output of inverter 607 may be slowed due to the small voltage potential (and correspondingly small current) of pulse 615, thereby impacting the frequency of ring oscillator 350. The frequency of ring oscillator 350 may then be measured and used to determine process variations present in NFET 605 (if any).

The above discussion focuses on turning on and off various PFETs in transmission gates to characterize localized process variations for NFETs in the transmission gates. In a similar technique, various NFETs in transmission gates may be turned on and off to characterize localized process variations for PFETs in the transmission gates. Therefore, the discussion of the characterization of localized process variations for NFETs should not be construed as being limiting to either the scope or the spirit of the embodiments.

Figure 7:
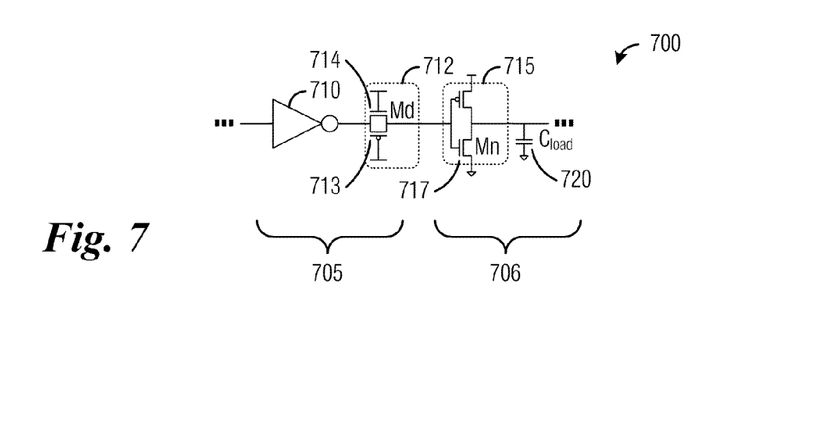
FIG. 7 is a diagram of an equivalent circuit of a portion of a ring oscillator.

FIG. 7 is a diagram illustrating a portion of a ring oscillator 700. Two stages (stage 705 and stage 706) of ring oscillator 700 are shown in FIG. 7. Stage 705 includes an inverter 710 and a transmission gate 712, wherein PMOS transistor 713 is turned off, leaving only NMOS transistor 714. For discussion purposes, NMOS transistor 714 is referred to as "Md." Stage 706 includes an inverter 715 and a capacitor 720. Capacitor 720 may be representative of an output impedance seen by inverter 715 and may include loading due to a transmission gate of stage 706 as well as other stages in ring oscillator 700. Inverter 715 includes an NMOS transistor 717, which is also referred to as "Mn."

With PMOS transistor 713 turned off, a turn-on resistance of Mn (NMOS transistor 717) may be expressed as:

$$R_{Mn} = \frac{V_{ds}}{I_d} = \frac{V_{ds}}{\frac{\beta}{2}(V_{gs} - V_{th,Mn})^2} = \frac{V_{ds}}{\frac{\beta}{2}(V_{dd} - V_{th,Mn} - V_{th,Md})^2},$$

where $V_{ds}$ is the drain-source voltage of Mn, $V_{gs}$ is the gate-source voltage of Mn, $V_{dd}$ is the supply voltage, $V_{th,Mn}$ is the threshold voltage of Mn, $V_{th,Md}$ is the threshold voltage of Md (NMOS transistor 714), and $\beta$ is the current gain.

As shown in the equation for the turn-on resistance of Mn, if the $V_{th,Md}$ is increased, then the turn-on resistance also increases. Increased turn-on resistance may slow down the frequency of ring oscillator 700 due to the increased time constant. Therefore, if the frequency of ring oscillator 700 decreases, then the threshold voltage ($V_{th}$) of Mn may be larger than expected. Similarly, if the frequency of ring oscillator 700 increases, then the threshold voltage of Mn may be smaller than expected.

A comparison may be made between the frequency of ring oscillator 700 in a baseline state wherein all transmission gates are turned on (in a configuration like that shown in FIG. 4a), referred to as $F_{org}$, and the frequency of ring oscillator 700 wherein one of the transmission gates has a transistor turned off (for example, PMOS transistor 713, as shown in FIG. 7, i.e., test configuration), referred to as $F_{dut}$.

As an example, a ratio of time constants of ring oscillator 700 in its baseline configuration ($\tau_{org}$) and ring oscillator 700 in test configuration ($\tau_{dut}$) may be expressed as:

$$\frac{\tau_{dut}}{\tau_{org}} = \frac{R_{Mn'} \cdot C_{load}}{R_{Mn} \cdot C_{load}} = \frac{(V_{dd} - V_{th,Mn})^2}{(V_{dd} - V_{th,Mn} - V_{th,Md})^2},$$

where $R_{Mn}$ is the turn-on resistance of Mn in ring oscillator 700 in its baseline configuration, $R_{Mn'}$ is the turn-on resistance of Mn in ring oscillator 700 in test configuration, and $C_{load}$ is the capacitance of capacitor 720.

It may be possible to rewrite the equation above expressing the ratio of time constant of ring oscillator 700 in baseline configuration to time constant of ring oscillator 700 in test configuration in terms of frequency and threshold voltage as:

$$F = \frac{b}{(V_{th} + a)^2},$$

where a and b are curve fitting coefficients and may be dependent on actual fabrication process parameters.

Figure 8:
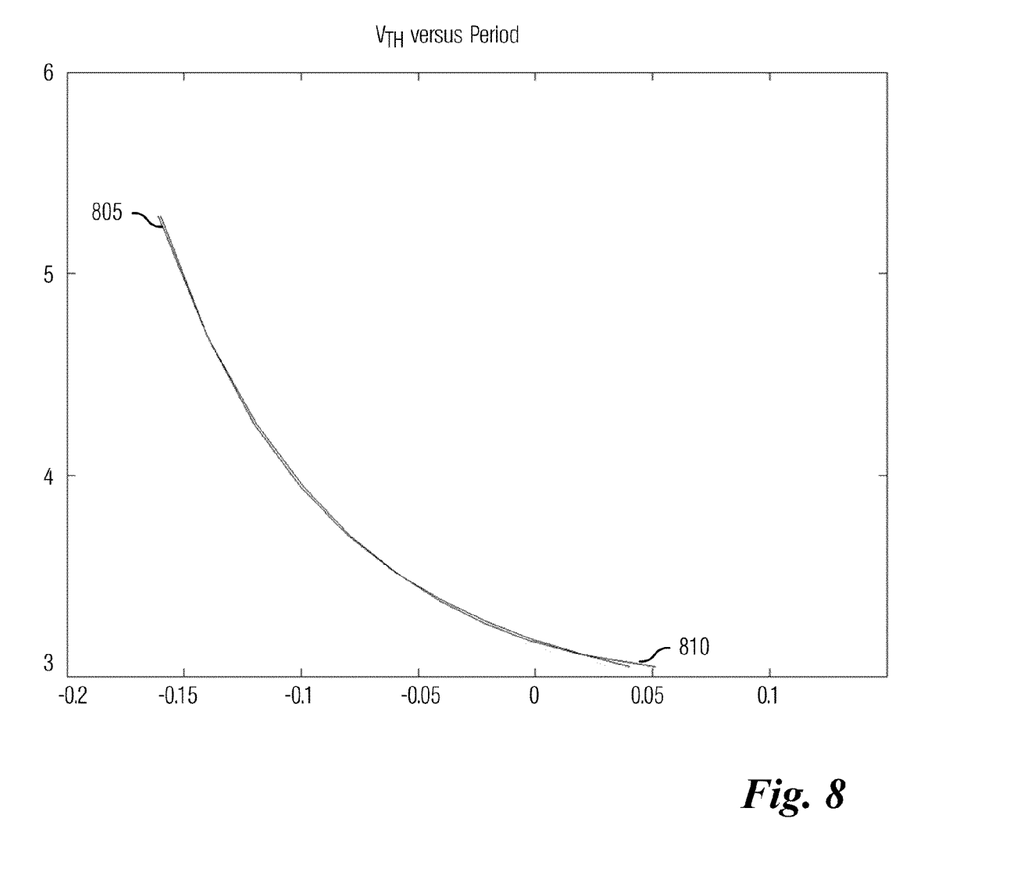
FIG. 8 is a data plot of threshold voltage versus period.

FIG. 8 is a diagram illustrating a data plot 800 of threshold voltage (in volts) versus period (in hundreds of picoseconds). A first curve 805 displays simulated data of a relationship between threshold voltage and period for an exemplary fabrication process and a second curve 810 displays a curve fitted to the simulated data. The curve may be expressed as $$F = \frac{b}{(V_{th} + a)^2}$$

with curve fitting coefficients a and b specific to the exemplary fabrication process.

Figure 9A:
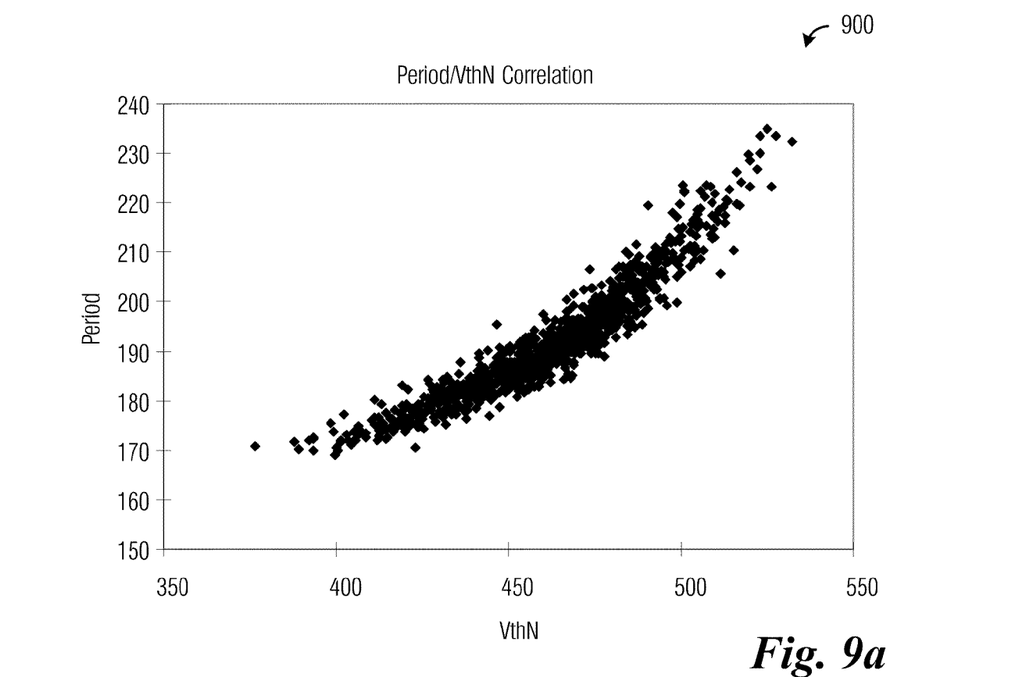
FIGS. 9a and 9b are data plots of a correlation between threshold voltage and period.
Figure 9B:
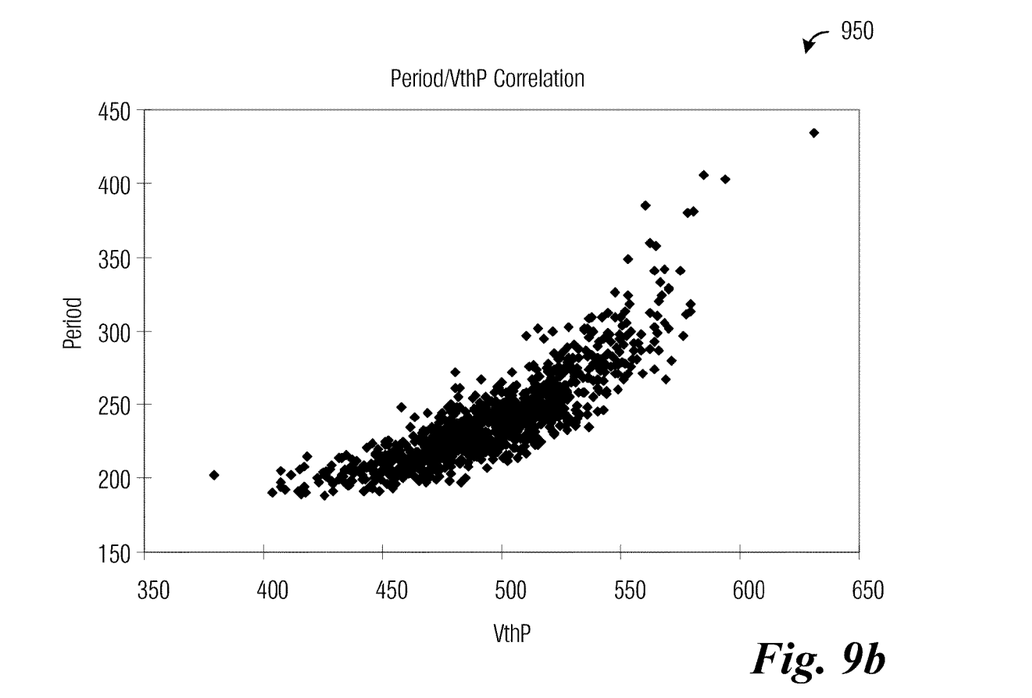

FIGS. 9a and 9b are diagrams illustrating data plots of threshold voltage versus period for NMOS devices (data plot 900) and PMOS devices (data plot 950) of an exemplary fabrication process. Data shown in the data plots are computed using monte-carlo simulation techniques. The data plots show that for the exemplary fabrication process, there is a correlation of about 0.937 between threshold voltage and period for NMOS devices and about 0.852 between threshold voltage and period for PMOS devices. This may be seen graphically in the data plots by a tighter vertical clustering of the data in data plot 900 compared to the data in data plot 950.

Figures 10, 11A:
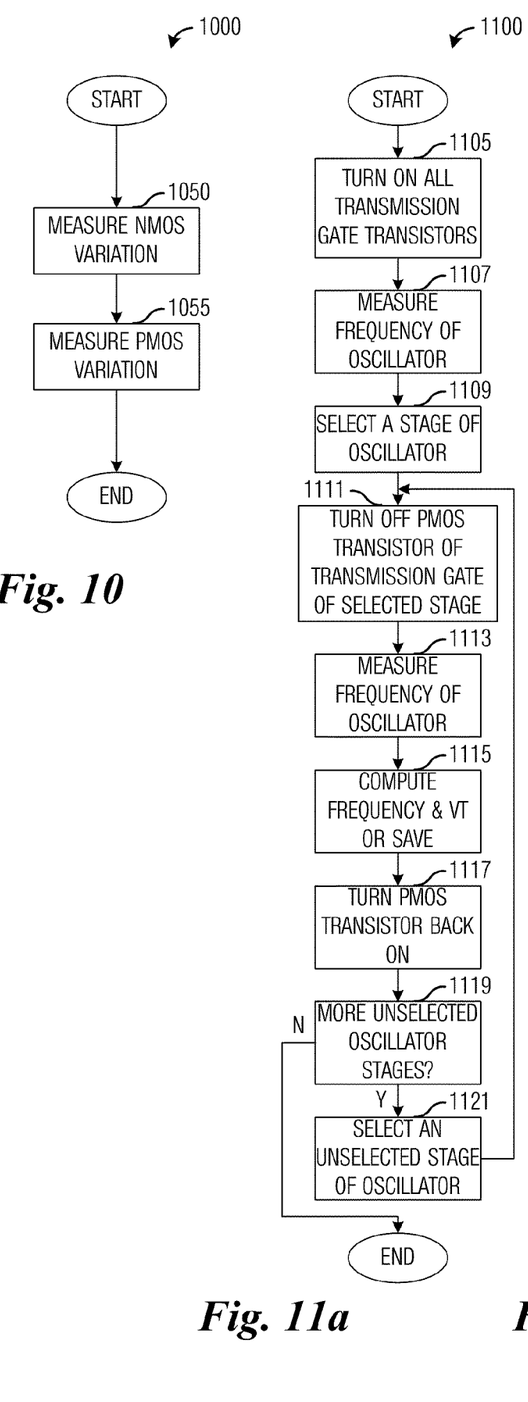
FIG. 10 is a flow diagram of characterizing process variations.
FIG. 11a is a flow diagram of characterizing process variations in NMOS devices.

FIG. 10 is a flow diagram 1000 for use in characterizing process variations in an integrated circuit. The characterizing of process variations may involve local characterizing of process variations as well as global characterizing of process variations. The characterizing of process variations may make use of ring oscillators with a number of inverters arranged serially in a loop and a transmission gate for each inverter.

The characterizing of process variations may include a separate characterizing of process variations for NMOS devices (block 1050) and PMOS devices (block 1055) in the integrated circuit. In one embodiment, process variations of NMOS devices may be locally characterized and then process variations PMOS devices may then be locally characterized. In another embodiment, process variations of PMOS devices may be characterized before the NMOS devices. In yet another embodiment, process variations of NMOS devices and PMOS devices may be characterized in an alternating fashion.

FIG. 11a is a flow diagram 1100 of the characterizing of process variations in NMOS devices. The characterizing of process variations in NMOS devices described in flow diagram 1100 may be a local characterizing of process variations. The characterizing of process variations may be a two-stage process, with a first stage involving a baseline frequency of the ring oscillator and a second stage involving a measurement of a frequency of the ring oscillator for each of a plurality of ring oscillator stages. The characterizing of process variations in NMOS devices may be an implementation of measuring NMOS variation (block 1050 of FIG. 10).

The characterizing of process variations may begin with turning on all transmission gates in the ring oscillator (block 1105) and then measuring the frequency of the ring oscillator 1107). The two operations (blocks 1105 and 1107) may make up the first stage of the characterizing of process variations and may provide the baseline frequency of the ring oscillator, which may be used to determine process variations for the NMOS devices to be characterized in the second stage of the characterizing of process variations. The first stage of the characterizing of process variations may also provide a global characterization of process variations if the baseline frequency is compared to an expected frequency based on nominal values of inverters in the ring oscillator.

The second stage of the characterizing of process variations in NMOS devices may begin with the selecting of a stage of the ring oscillator (block 1109). The selecting of a stage of the ring oscillator only selects stages that include a transmission gate having independently controllable transistors, such as those shown in FIGS. 3a and 3b. After selecting the stage of the ring oscillator, the PMOS transistor of the transmission gate may be turned off (block 1111). The PMOS transistor may be turned off by asserting a one (1) at the gate terminal of the PMOS transistor.

With the PMOS transistor turned off, the frequency of the ring oscillator may then be measured (block 1113). The frequency of the ring oscillator may then be analyzed to determine process variations, such as threshold voltage changes, of the NMOS transistor associated with the transmission gate of the selected stage of the ring oscillator (block 1115). Alternatively, the frequency may be stored for subsequent processing. After the frequency of the ring oscillator has been measured and then analyzed or saved, then the PMOS transistor may be turned back on (block 1117).

A check may then be performed to determine if there are anymore unselected stages of the ring oscillator (block 1119). If there are no more unselected stages of the ring oscillator, then the characterizing of process variations may terminate. However, if there are more unselected stages, then a previously unselected stage may be selected (block 1121) and the characterizing of process variations in NMOS devices may continue by returning to block 1111.

Figure 11B:
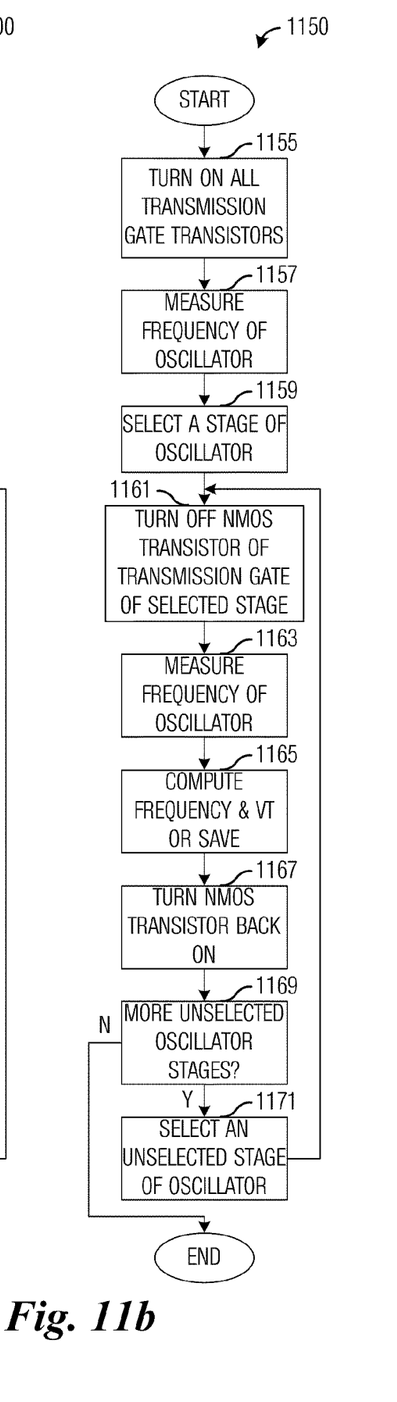
FIG. 11b is a flow diagram of characterizing process variations in PMOS devices.

FIG. 11b is a flow diagram 1150 of the characterizing of process variations in PMOS devices. The characterizing of process variations in PMOS devices described in flow diagram 1150 may be a local characterizing of process variations. The characterizing of process variations may be a two-stage process, with a first stage involving a baseline frequency of the ring oscillator and a second stage involving a measurement of a frequency of the ring oscillator for each of a plurality of ring oscillator stages. The characterizing of process variations in PMOS devices may be an implementation of measuring PMOS variation (block 1055 of FIG. 10).

The characterizing of process variations may begin with turning on all transmission gates in the ring oscillator (block 1155) and then measuring the frequency of the ring oscillator 1157). The two operations (blocks 1155 and 1157) may make up the first stage of the characterizing of process variations and may provide the baseline frequency of the ring oscillator, which may be used to determine process variations for the PMOS devices to be characterized in the second stage of the characterizing of process variations. The first stage of the characterizing of process variations may also provide a global characterization of process variations if the baseline frequency is compared to an expected frequency based on nominal values of inverters in the ring oscillator.

The second stage of the characterizing of process variations in PMOS devices may begin with the selecting of a stage of the ring oscillator (block 1159). The selecting of a stage of the ring oscillator only selects stages that include a transmission gate having independently controllable transistors, such as those shown in FIGS. 3a and 3b. After selecting the stage of the ring oscillator, the NMOS transistor of the transmission gate may be turned off (block 1161). The NMOS transistor may be turned off by asserting a zero (0) at the gate terminal of the NMOS transistor.

With the NMOS transistor turned off, the frequency of the ring oscillator may then be measured (block 1163). The frequency of the ring oscillator may then be analyzed to determine process variations, such as threshold voltage changes, of the PMOS transistor associated with the transmission gate of the selected stage of the ring oscillator (block 1165). Alternatively, the frequency may be stored for subsequent processing. After the frequency of the ring oscillator has been measured and then analyzed or saved, then the NMOS transistor may be turned back on (block 1167).

A check may then be performed to determine if there are anymore unselected stages of the ring oscillator (block 1169). If there are no more unselected stages of the ring oscillator, then the characterizing of process variations may terminate. However, if there are more unselected stages, then a previously unselected stage may be selected (block 1171) and the characterizing of process variations in NMOS devices may continue by returning to block 1161.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
   a plurality of inverters arranged in a sequential loop, the sequential loop having a single feedback to only the plurality of inverters in the sequential loop;
   a plurality of transmission gates, with each transmission gate coupled between a pair of serially arranged inverters, wherein a first one of the plurality of transmission gates comprises:
      a first field effect transistor (FET) having a first channel, and
      a second FET having a second channel,
      wherein the first channel and the second channel are coupled in parallel, and
      wherein a gate terminal of the first FET and a gate terminal of the second FET are coupled to a first control signal and a second control signal, respectively, wherein the first control signal and the second control signal are independent from each other; and
   wherein a second one of the plurality of transmission gates comprises a third FET coupled to a third control signal different from the first control signal and the second control signal.

2. The circuit of claim 1, wherein each FET in each transmission gate is controlled by an independent control signal.

3. The circuit of claim 1, wherein there are at least as many inverters in the plurality of inverters as there are transmission gates in the plurality of transmission gates.

4. The circuit of claim 1, wherein the first FET comprises an N-type FET (NFET) and the second FET comprises a P-type FET (PFET).

5. The circuit of claim 1, further comprising a logic gate having a first input coupled to an output of one of the inverters in the plurality of inverters and a second input coupled to an enable control signal, the logic gate to selectively turn on or off the circuit.

6. The circuit of claim 5, wherein the logic gate is a logic AND gate.

7. The circuit of claim 1, wherein there is an odd number of inverters in the plurality of inverters.

8. An integrated circuit comprising:
   integrated circuitry disposed on a substrate, the integrated circuitry configured to perform operations; and
   a ring oscillator disposed on the substrate, the ring oscillator configured to produce a clock signal at a frequency dependent on a configuration of elements in the ring oscillator having only one feedback loop and, the ring oscillator comprising,
      a plurality of inverters serially arranged in a loop, and
      a plurality of transmission gates, with each transmission gate coupled between a pair of inverters, each transmission gate has two field effect transistors (FET) arranged in parallel, with a gate terminal of a first FET coupled to a first control signal and a gate terminal of a second FET coupled to a second control signal, wherein the first control signal is unrelated to the second control signal and wherein a feedback loop is connected to only one transmission gate input; and
      a third FET located within a separate one of the plurality of transmission gates than the first FET and the second FET, with a gate terminal of the third FET coupled to a third control signal different from the first control signal and the second control signal.

9. The integrated circuit of claim 8, wherein there is a plurality of ring oscillators disposed on the substrate, and wherein the ring oscillators are distributed over the surface of the substrate.

10. The integrated circuit of claim 8, wherein the inverters in the ring oscillator are formed along an edge of the integrated circuit or along multiple edges of the integrated circuit.

11. A method for measuring process variations, the method comprising:
    characterizing process variations of a first type of field effect transistor (FET) in an integrated circuit using a ring oscillator, wherein the characterizing process variations comprises sending a first control signal to a first one of the first type of FET, a second control signal different from the first control signal to a second one of the first type of FET, and a third control signal to a second type of FET, the second type of FET connected in parallel with the first one of the first type of FET, wherein the third control signal is independent from the first control signal and wherein the ring oscillator provides a feedback to only a single transmission gate; and
    characterizing process variations of a second type of FET in the integrated circuit using the ring oscillator.

12. The method of claim 11, wherein the characterizing process variation of the first type of FET and the characterizing process variations of the second type of FET are local characterizations.

13. The method of claim 11, wherein the characterizing process variation of the first type of FET comprises:
    measuring a baseline frequency of the ring oscillator;
    selecting a transmission gate of a plurality of transmission gates in the ring oscillator, wherein the transmission gate comprises a transistor of the first type of FET and a transistor of the second type of FET;
    turning off the transistor of the second type of FET in the selected transmission gate;
    measuring a test frequency of the ring oscillator; and repeating the selecting, the turning off, and the measuring for other transmission gates in the plurality of transmission gates.

14. The method of claim 13, wherein the characterizing process variation of the first type of FET further comprises quantifying a process variation of the transistor of the first type of FET based on the measured test frequency.

15. The method of claim 14, wherein the measured test frequency is inversely proportional to a threshold voltage.

16. The method of claim 15, wherein a relationship between the measured test frequency and the threshold voltage of the transistor of the first type of FET is expressible as:

$$F = \frac{b}{(V_{th} + a)^2},$$

where F is the test frequency, $V_{th}$ is the threshold voltage, a and b are curve fitting coefficients specific to a fabrication process.

17. The method of claim 13, wherein the characterizing process variation of the first type of FET further comprises saving the measured test frequency.

18. The method of claim 13, wherein the characterizing process variation of the first type of FET further comprises after the measuring a test frequency, turning on the transistor of the second type of FET in the selected transmission gate.

19. The method of claim 11, wherein the characterizing process variation of the second type of FET comprises:
measuring a baseline frequency of the ring oscillator;
selecting a transmission gate of a plurality of transmission gates in the ring oscillator, wherein the transmission gate comprises a transistor of the first type of FET and a transistor of the second type of FET;
turning off the transistor of the first type of FET in the selected transmission gate;
measuring a test frequency of the ring oscillator; and
repeating the selecting, the turning off, and the measuring for other transmission gates in the plurality of transmission gates.

20. The method of claim 19, wherein the characterizing process variation of the second type of FET further comprises quantifying a process variation of the transistor of the second type of FET based on the measured test frequency.

21. A method for measuring process variations, the method comprising:
characterizing process variations of a first type of field effect transistor (FET) in an integrated circuit using a ring oscillator;
characterizing process variations of a second type of FET in the integrated circuit using the ring oscillator, wherein the characterizing process variation of the first type of FET comprises:
measuring a baseline frequency of the ring oscillator;
selecting a transmission gate of a plurality of transmission gates in the ring oscillator, wherein the transmission gate comprises a transistor of the first type of FET and a transistor of the second type of FET;
turning off the transistor of the second type of FET in the selected transmission gate; and
measuring a test frequency of the ring oscillator; and
repeating the selecting, the turning off, and the measuring for other transmission gates in the plurality of transmission gates.

22. The method of claim 21, wherein the characterizing process variation of the first type of FET further comprises quantifying a process variation of the transistor of the first type of FET based on the measured test frequency.

23. A method for measuring process variations, the method comprising:
characterizing process variations of a first type of field effect transistor (FET) in an integrated circuit using a ring oscillator; and
characterizing process variations of a second type of FET in the integrated circuit using the ring oscillator, wherein the characterizing process variations of the second type of FET further comprises:
measuring a baseline frequency of the ring oscillator;
selecting a transmission gate of a plurality of transmission gates in the ring oscillator, wherein the transmission gate comprises a transistor of the first type of FET and a transistor of the second type of FET;
turning off the transistor of the first type of FET in the selected transmission gate;
measuring a test frequency of the ring oscillator; and
repeating the selecting, the turning off, and the measuring for other transmission gates in the plurality of transmission gates.

24. The method of claim 23, wherein the characterizing process variations of the second type of FET further comprises quantifying a process variation of the transistor of the second type of FET based on the measured test frequency.

* * * * *